(12) United States Patent
Lakkis

(10) Patent No.: US 8,392,814 B2
(45) Date of Patent: Mar. 5, 2013

(54) METHOD AND APPARATUS FOR HIGH SPEED STRUCTURED MULTI RATE LOW DENSITY PARITY CHECK CODES

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 865 days.

(21) Appl. No.: 12/496,464

(22) Filed: Jul. 1, 2009

(65) Prior Publication Data

US 2010/0088573 A1    Apr. 8, 2010

Related U.S. Application Data

(60) Provisional application No. 61/103,533, filed on Oct. 7, 2008.

(51) Int. Cl.
*H03M 13/00*    (2006.01)
(52) U.S. Cl. ...................................................... 714/804
(58) Field of Classification Search .................. 714/752, 714/800–801, 804, 807
See application file for complete search history.

(56) References Cited

U.S. PATENT DOCUMENTS

| 7,222,289 B2 * | 5/2007 | Hung | 714/807 |
| 7,395,494 B2 | 7/2008 | Lee et al. | |
| 7,523,375 B2 * | 4/2009 | Spencer | 714/752 |

FOREIGN PATENT DOCUMENTS

| TW | 200838159 A | 9/2008 |
| WO | WO2007019187 | 2/2007 |

OTHER PUBLICATIONS

Lin et al., Long length LDPC code construction and the corresponding decoder implementation with adjustable parallelism, May 2008, IEEE, p. 1423-1427.*
Lan Lan et al., Algebraic construction of quasi cycle LDPC codes— Part!: for AWGN and binary random earsure channels, 2006, Springer-Verlag, p. 255-264.*
Yang et al. Code construction and FPGA implementation of low-error-floor multirate Low Density PArity Check code decoder, 2006, IEEE, p. 892-904.*
Zhang et al., Layered approx-regular LDPC: code constuction and encoder/decoder design, Mar. 2008, IEEE, Trans. on Circuits and Sys., !:regular papers, vol. 55, No. 2, p. 572-585.*
International Preliminary Report on Patentability—PCT/US2009/059885, The International Bureau of WIPO—Geneva, Switzerland, Jan. 17, 2011.
International Search Report & Written Opinion—PCT/US09/059885, International Search Authority—European Patent Office— Mar. 18, 2010.
Taiwan Search Report—TW098134025—TIPO—Nov. 12, 2012.

* cited by examiner

*Primary Examiner* — Shelly A Chase
(74) *Attorney, Agent, or Firm* — Dang M. Vo

(57) ABSTRACT

Certain aspects of the present disclosure relate to a method for designing structured multi-rate low-density parity-check (LDPC) codes. These LDPC codes can be also adapted to support efficient encoding.

35 Claims, 12 Drawing Sheets

| 0 | $J^7$ | 0 | $J^0$ | 0 | 0 | 0 | $J^{14}$ | 0 | 0 | 0 | $J^{10}$ | $J^4$ | 0 | 0 | 0 | $J^8$ |
|---|---|---|---|---|---|---|---|---|---|---|---|---|---|---|---|---|
| $J^3$ | 0 | 0 | 0 | 0 | $J^{11}$ | 0 | 0 | $J^6$ | $J^2$ | 0 | 0 | 0 | $J^{13}$ | 0 | $J^{17}$ | 0 |
| 0 | 0 | $J^8$ | 0 | $J^{15}$ | 0 | $J^{19}$ | 0 | 0 | 0 | $J^{18}$ | 0 | 0 | 0 | $J^{20}$ | $J^{16}$ | 0 |
| 0 | 0 | $J^7$ | 0 | $J^0$ | 0 | 0 | 0 | $J^{14}$ | $J^{10}$ | 0 | 0 | 0 | 0 | $J^4$ | $J^{16}$ | 0 |
| 0 | $J^3$ | 0 | $J^{11}$ | 0 | 0 | $J^6$ | 0 | 0 | 0 | $J^2$ | 0 | $J^{20}$ | 0 | 0 | 0 | $J^{17}$ |
| $J^8$ | 0 | 0 | 0 | 0 | $J^{15}$ | 0 | $J^{19}$ | 0 | 0 | 0 | $J^{18}$ | 0 | $J^{13}$ | 0 | 0 | $J^8$ | 0 |
| $J^7$ | 0 | 0 | 0 | 0 | $J^0$ | $J^{14}$ | 0 | 0 | 0 | $J^{10}$ | 0 | 0 | $J^{20}$ | 0 | 0 | $J^8$ | 0 |
| 0 | 0 | $J^3$ | 0 | $J^{11}$ | 0 | 0 | $J^6$ | 0 | 0 | 0 | $J^2$ | 0 | 0 | $J^4$ | $J^{17}$ | 0 | 0 |
| 0 | $J^8$ | 0 | $J^{15}$ | 0 | 0 | 0 | 0 | $J^{19}$ | $J^{18}$ | 0 | 0 | $J^{13}$ | 0 | 0 | 0 | $J^{16}$ |

FIG. 6

| 0 | $J^7$ | 0 | $J^0$ | 0 | 0 | 0 | $J^{14}$ | 0 | 0 | 0 | $J^{10}$ | $J^4$ | 0 | 0 | 0 | 0 | $J^8$ |
|---|---|---|---|---|---|---|---|---|---|---|---|---|---|---|---|---|---|
| $J^3$ | 0 | 0 | 0 | 0 | $J^{11}$ | 0 | 0 | $J^6$ | $J^2$ | 0 | 0 | 0 | $J^{13}$ | 0 | 0 | $J^{17}$ | 0 |
| 0 | 0 | $J^8$ | 0 | $J^{15}$ | 0 | $J^{19}$ | 0 | 0 | 0 | $J^{18}$ | 0 | 0 | 0 | $J^{20}$ | $J^{16}$ | 0 | 0 |
| 0 | 0 | $J^{11}$ | 0 | $J^4$ | 0 | 0 | 0 | $J^6$ | $J^3$ | 0 | 0 | 0 | 0 | $J^{20}$ | $J^{14}$ | 0 | 0 |
| 0 | $J^9$ | 0 | $J^{16}$ | 0 | 0 | $J^0$ | 0 | 0 | 0 | $J^{18}$ | 0 | $J^5$ | 0 | 0 | 0 | 0 | $J^9$ |
| $J^2$ | 0 | 0 | 0 | 0 | $J^{11}$ | 0 | $J^2$ | 0 | 0 | 0 | $J^{16}$ | 0 | $J^{13}$ | 0 | 0 | $J^{19}$ | 0 |
| $J^3$ | 0 | 0 | 0 | 0 | $J^{17}$ | $J^8$ | 0 | 0 | 0 | $J^9$ | 0 | 0 | $J^{18}$ | 0 | 0 | $J^{21}$ | 0 |
| 0 | 0 | $J^{15}$ | 0 | $J^{13}$ | 0 | 0 | $J^{10}$ | 0 | 0 | 0 | $J^7$ | 0 | 0 | $J^{20}$ | $J^4$ | 0 | 0 |
| 0 | $J^4$ | 0 | $J^0$ | 0 | 0 | 0 | 0 | $J^6$ | $J^2$ | 0 | 0 | $J^8$ | 0 | 0 | 0 | 0 | $J^2$ |

FIG. 7

| $J^3$ | $J^7$ | $J^8$ | $J^0$ | $J^{15}$ | $J^{11}$ | $J^{19}$ | $J^{14}$ | $J^6$ | $J^2$ | $J^{18}$ | $J^{10}$ | $J^4$ | $J^{13}$ | $J^{20}$ | $J^{16}$ | $J^{17}$ | $J^8$ |
|---|---|---|---|---|---|---|---|---|---|---|---|---|---|---|---|---|---|
| $J^8$ | $J^3$ | $J^7$ | $J^{11}$ | $J^0$ | $J^{15}$ | $J^6$ | $J^{19}$ | $J^{14}$ | $J^{10}$ | $J^2$ | $J^{18}$ | $J^{20}$ | $J^{13}$ | $J^4$ | $J^{16}$ | $J^8$ | $J^{17}$ |
| $J^7$ | $J^8$ | $J^3$ | $J^{15}$ | $J^{11}$ | $J^0$ | $J^{14}$ | $J^6$ | $J^{19}$ | $J^{18}$ | $J^{10}$ | $J^2$ | $J^{13}$ | $J^{20}$ | $J^4$ | $J^{17}$ | $J^8$ | $J^{16}$ |

FIG. 8

| $J^3$ | $J^7$ | 0 | $J^0$ | 0 | $J^{11}$ | 0 | $J^{14}$ | $J^6$ | $J^2$ | 0 | $J^{10}$ | $J^4$ | $J^{13}$ | 0 | 0 | $J^{17}$ | $J^8$ |
|---|---|---|---|---|---|---|---|---|---|---|---|---|---|---|---|---|---|
| 0 | 0 | $J^8$ | 0 | $J^{15}$ | 0 | $J^{19}$ | 0 | 0 | 0 | $J^{18}$ | 0 | 0 | 0 | $J^{20}$ | $J^{16}$ | 0 | 0 |
| 0 | $J^3$ | $J^7$ | $J^{11}$ | $J^0$ | 0 | $J^6$ | 0 | $J^{14}$ | $J^{10}$ | $J^2$ | 0 | $J^{20}$ | 0 | $J^4$ | $J^{16}$ | 0 | $J^{17}$ |
| 0 | $J^3$ | 0 | $J^{11}$ | 0 | 0 | $J^6$ | 0 | 0 | 0 | $J^2$ | 0 | $J^{20}$ | 0 | 0 | 0 | 0 | $J^{17}$ |
| $J^7$ | 0 | $J^3$ | 0 | $J^{11}$ | $J^0$ | $J^{14}$ | $J^6$ | 0 | 0 | $J^{10}$ | $J^2$ | 0 | $J^{20}$ | $J^4$ | $J^{17}$ | $J^8$ | 0 |
| 0 | $J^8$ | 0 | $J^{15}$ | 0 | 0 | 0 | 0 | $J^{19}$ | $J^{18}$ | 0 | 0 | $J^{13}$ | 0 | 0 | 0 | 0 | $J^{16}$ |

FIG. 9

| 0 | $J^7$ | 0 | $J^0$ | 0 | 0 | 0 | $J^{14}$ | 0 | 0 | 0 | $J^{10}$ | 0 | 0 | 0 | 0 | 0 | 0 |
|---|---|---|---|---|---|---|---|---|---|---|---|---|---|---|---|---|---|
| $J^3$ | 0 | 0 | 0 | 0 | $J^{11}$ | 0 | 0 | $J^6$ | $J^2$ | 0 | 0 | 0 | 0 | 0 | 0 | 0 | 0 |
| 0 | 0 | $J^8$ | 0 | $J^{15}$ | 0 | $J^{19}$ | 0 | 0 | 0 | $J^{18}$ | 0 | 0 | 0 | 0 | 0 | 0 | 0 |
| 0 | 0 | $J^7$ | 0 | $J^0$ | 0 | 0 | 0 | $J^{14}$ | $J^{10}$ | 0 | 0 | 0 | 0 | $J^4$ | 0 | 0 | 0 |
| 0 | $J^3$ | 0 | $J^{11}$ | 0 | 0 | $J^6$ | 0 | 0 | 0 | $J^2$ | 0 | $J^{20}$ | 0 | 0 | 0 | 0 | 0 |
| $J^8$ | 0 | 0 | 0 | 0 | $J^{15}$ | 0 | $J^{19}$ | 0 | 0 | 0 | $J^{18}$ | 0 | $J^{13}$ | 0 | 0 | 0 | 0 |
| $J^7$ | 0 | 0 | 0 | 0 | $J^0$ | $J^{14}$ | 0 | 0 | 0 | $J^{10}$ | 0 | 0 | $J^{20}$ | 0 | 0 | $J^8$ | 0 |
| 0 | 0 | $J^3$ | 0 | $J^{11}$ | 0 | 0 | $J^6$ | 0 | 0 | 0 | $J^2$ | 0 | 0 | $J^4$ | $J^{17}$ | 0 | 0 |
| 0 | $J^8$ | 0 | $J^{15}$ | 0 | 0 | 0 | 0 | $J^{19}$ | $J^{18}$ | 0 | 0 | $J^{13}$ | 0 | 0 | 0 | 0 | $J^{16}$ |

FIG. 10

| 0 | $J^7$ | 0 | $J^0$ | 0 | 0 | 0 | $J^{14}$ | 0 | 0 | 0 | $J^{10}$ | $J^4$ | 0 | 0 | 0 | 0 |
|---|---|---|---|---|---|---|---|---|---|---|---|---|---|---|---|---|
| $J^3$ | 0 | 0 | 0 | 0 | $J^{11}$ | 0 | 0 | $J^6$ | $J^2$ | 0 | 0 | 0 | $J^{13}$ | 0 | 0 | 0 |
| 0 | 0 | $J^8$ | 0 | $J^{15}$ | 0 | $J^{19}$ | 0 | 0 | 0 | $J^{18}$ | 0 | 0 | 0 | $J^{20}$ | 0 | 0 |
| 0 | 0 | $J^7$ | 0 | $J^0$ | 0 | 0 | 0 | $J^{14}$ | $J^{10}$ | 0 | 0 | 0 | 0 | 0 | 0 | 0 |
| 0 | $J^3$ | 0 | $J^{11}$ | 0 | 0 | $J^6$ | 0 | 0 | 0 | $J^2$ | 0 | 0 | 0 | 0 | 0 | 0 |
| $J^8$ | 0 | 0 | 0 | 0 | $J^{15}$ | 0 | $J^{19}$ | 0 | 0 | 0 | $J^{18}$ | 0 | 0 | 0 | 0 | 0 |
| $J^7$ | 0 | 0 | 0 | 0 | $J^0$ | $J^{14}$ | 0 | 0 | 0 | $J^{10}$ | 0 | 0 | $J^{20}$ | 0 | 0 | $J^8$ | 0 |
| 0 | 0 | $J^3$ | 0 | $J^{11}$ | 0 | 0 | $J^6$ | 0 | 0 | 0 | $J^2$ | 0 | 0 | $J^4$ | $J^{17}$ | 0 | 0 |
| 0 | $J^8$ | 0 | $J^{15}$ | 0 | 0 | 0 | 0 | $J^{19}$ | $J^{18}$ | 0 | 0 | $J^{13}$ | 0 | 0 | 0 | 0 | $J^{16}$ |

FIG. 11

| $J^3$ | $J^7$ | $J^8$ | $J^0$ | $J^{15}$ | $J^{11}$ | $J^{19}$ | $J^{14}$ | $J^6$ | $J^2$ | $J^{18}$ | $J^{10}$ | $J^4$ | $J^{13}$ | $J^{20}$ | $J^{16}$ | 0 | 0 |
|---|---|---|---|---|---|---|---|---|---|---|---|---|---|---|---|---|---|
| $J^8$ | $J^3$ | $J^7$ | $J^{11}$ | $J^0$ | $J^{15}$ | $J^6$ | $J^{19}$ | $J^{14}$ | $J^{10}$ | $J^2$ | $J^{18}$ | $J^{20}$ | $J^{13}$ | $J^4$ | $J^{16}$ | $J^8$ | 0 |
| $J^7$ | $J^8$ | $J^3$ | $J^{15}$ | $J^{11}$ | $J^0$ | $J^{14}$ | $J^6$ | $J^{19}$ | $J^{18}$ | $J^{10}$ | $J^2$ | $J^{13}$ | $J^{20}$ | $J^4$ | $J^{17}$ | $J^8$ | $J^{16}$ |

$$[H_d \ H_p]\begin{bmatrix}d\\p\end{bmatrix} = 0 \Leftrightarrow H_d d = H_p p = v = \begin{bmatrix}v_0\\v_1\\v_2\\v_3\end{bmatrix}$$

FIG. 13

METHOD AND APPARATUS FOR HIGH SPEED STRUCTURED MULTI RATE LOW DENSITY PARITY CHECK CODES

CLAIM OF PRIORITY UNDER 35 U.S.C. §119

The present application for patent claims priority to Provisional Application No. 61/103,533 filed Oct. 7, 2008, and assigned to the assignee hereof and hereby expressly incorporated by reference herein.

BACKGROUND

1. Field

Certain aspects of the present disclosure generally relate to a wireless communication and, more particularly, to a method and an apparatus for designing structured multi-rate low-density parity-check (LDPC) codes.

2. Background

Error correcting codes are widely utilized in wireless communications. Error correcting codes compensate for an intrinsic unreliability of transmitted information by introducing redundancy into a data stream. Considerable interest has recently grown in a class of codes known as low-density parity-check (LDPC) codes. LDPC codes have been demonstrated to provide error-rate performance close to channel capacity, which represents a lower bound for wireless transmissions.

Encoding of LDPC codes refers to a procedure that produces a codeword from a set of information bits by incorporating a certain number of redundant bits. Rate of an LDPC code is defined as a ratio of a number of information bits and a total number of encoded bits (i.e., information bits and redundant bits).

Emerging wireless communication standards continuously evolve. Because of that, it is important to design LDPC codes that are flexible to support multi-rate encoding at a transmitter side. Furthermore, in order to allow high data rate communications, important consideration is also to achieve high-speed encoding with affordable computational complexity.

Therefore, there is a need in the art for a method to generate flexible multi-rate LDPC codes with structures that support high speed encoding process.

SUMMARY

Certain aspects provide a method for wireless communications. The method generally includes encoding data to generate a packet of encoded data, wherein the data are encoded at one or more rates based on one or more low-density parity-check (LDPC) matrices having square sub-matrices, wherein at least one of the square sub-matrices comprises rows and columns of blocks, and further wherein the at least one of the square sub-matrices comprises only one non-zero block per row and only one non-zero block per column, and transmitting the packet.

Certain aspects provide an apparatus for wireless communications. The apparatus generally includes an encoder configured to encode data to generate a packet of encoded data, wherein the data are encoded at one or more rates based on one or more low-density parity-check (LDPC) matrices having square sub-matrices, wherein at least one of the square sub-matrices comprises rows and columns of blocks, and further wherein the at least one of the square sub-matrices comprises only one non-zero block per row and only one non-zero block per column, and a transmitter configured to transmit the packet.

Certain aspects provide an apparatus for wireless communications. The apparatus generally includes means for encoding data to generate a packet of encoded data, wherein the data are encoded at one or more rates based on one or more low-density parity-check (LDPC) matrices having square sub-matrices, wherein at least one of the square sub-matrices comprises rows and columns of blocks, and further wherein the at least one of the square sub-matrices comprises only one non-zero block per row and only one non-zero block per column, and means for transmitting the packet.

Certain aspects provide a computer-program product for wireless communications. The computer-program product includes a computer-readable medium comprising instructions executable to encode data to generate a packet of encoded data, wherein the data are encoded at one or more rates based on one or more low-density parity-check (LDPC) matrices having square sub-matrices, wherein at least one of the square sub-matrices comprises rows and columns of blocks, and further wherein the at least one of the square sub-matrices comprises only one non-zero block per row and only one non-zero block per column, and transmit the packet.

Certain aspects provide a wireless node. The wireless node generally includes at least one antenna, an encoder configured to encode data to generate a packet of encoded data, wherein the data are encoded at one or more rates based on one or more low-density parity-check (LDPC) matrices having square sub-matrices, wherein at least one of the square sub-matrices comprises rows and columns of blocks, and further wherein the at least one of the square sub-matrices comprises only one non-zero block per row and only one non-zero block per column, and a transmitter configured to transmit the packet via the at least one antenna.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 6 illustrates an example PCM of rate-½ LDPC code in accordance with certain aspects of the present disclosure.

FIG. 7 illustrates another example PCM of rate-½ LDPC code in accordance with certain aspects of the present disclosure.

FIG. 8 illustrates an example PCM of rate-⅚ LDPC code in accordance with certain aspects of the present disclosure.

FIG. 9 illustrates an example PCM of rate-⅔ LDPC code in accordance with certain aspects of the present disclosure.

FIG. 10 illustrates an example of a PCM structure suitable for efficient encoding of rate-½ LDPC code in accordance with certain aspects of the present disclosure.

FIG. 11 illustrates another example of a PCM structure suitable for efficient encoding of rate-½ LDPC code in accordance with certain aspects of the present disclosure.

FIG. 12 illustrates an example of a PCM structure suitable for efficient encoding of rate-⅚ LDPC code in accordance with certain aspects of the present disclosure.

FIG. 13 illustrates an efficient LDPC encoding method in accordance with certain aspects of the present disclosure.

DETAILED DESCRIPTION

Figure 1:
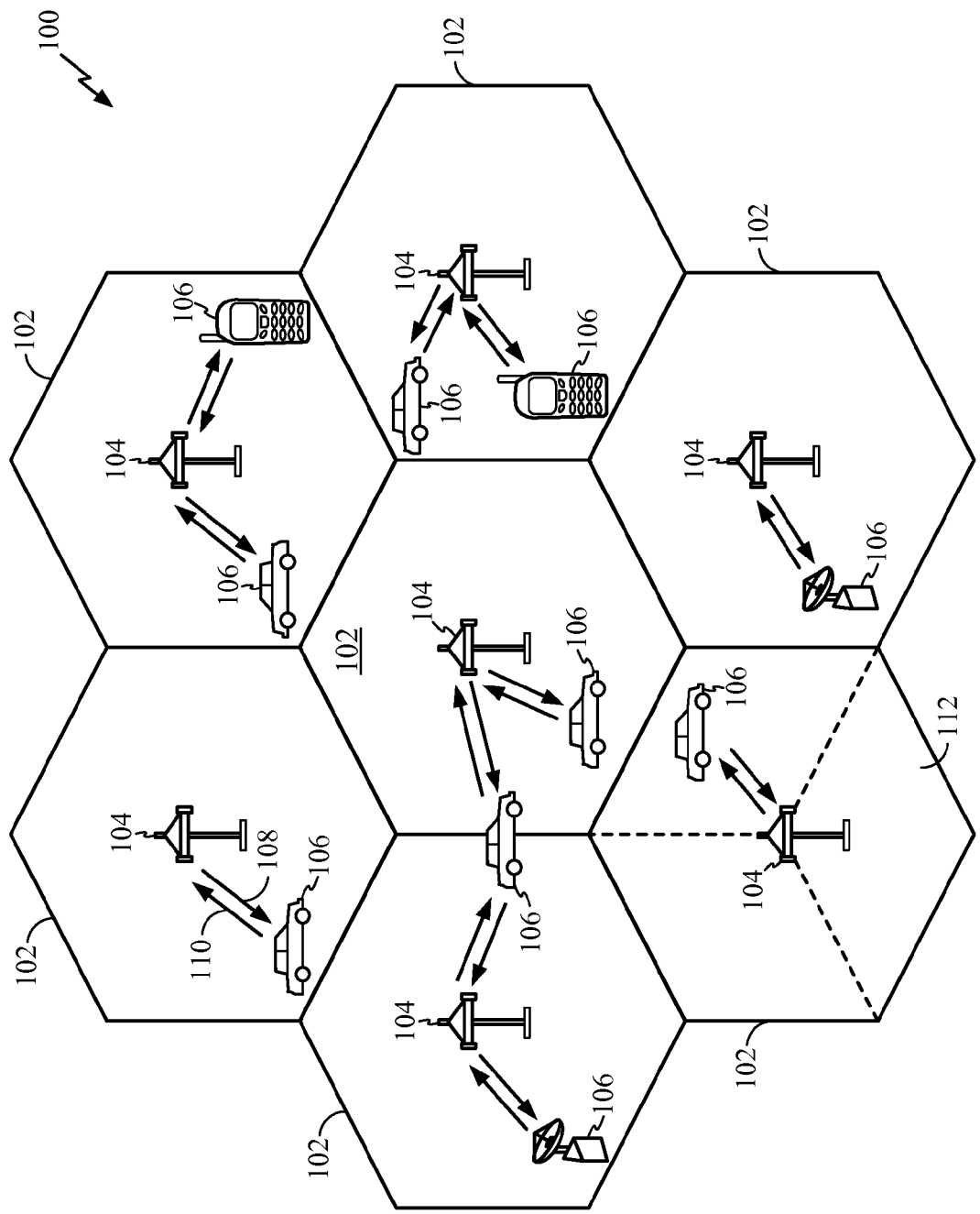
FIG. 1 illustrates an example wireless communication system, in accordance with certain aspects of the present disclosure.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless Communication System

The techniques described herein may be used for various broadband wireless communication systems, including communication systems that are based on a single carrier transmission. Aspects disclosed herein may be advantageous to systems employing single-carrier and Orthogonal Frequency Division Multiplexing (OFDM) signals used in millimeter wave systems, such as defined by the Institute of Electrical and Electronics Engineers (IEEE) 802.15.3c protocol and the Very High Throughput (VHT) 60 protocol. However, the present disclosure is not intended to be limited to such systems, as other applications may benefit from similar advantages.

The teachings herein may be incorporated into (e.g., implemented within or performed by) a variety of wired or wireless apparatuses (e.g., nodes). In some aspects, a wireless node implemented in accordance with the teachings herein may comprise an access point or an access terminal or a piconet controller or other type of wireless device.

An access point ("AP") may comprise, be implemented as, or known as NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as an access terminal, a subscriber station, a subscriber unit, a mobile station, a remote station, a remote terminal, a user terminal, a user agent, a user device, user equipment, or some other terminology. In some implementations an access terminal may comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music or video device, or a satellite radio), a global positioning system device, or any other suitable device that is configured to communicate via a wireless or wired medium. In some aspects the node is a wireless node. Such wireless node may provide, for example, connectivity for or to a network (e.g., a wide area network such as the Internet or a cellular network) via a wired or wireless communication link.

FIG. 1 illustrates an example of a wireless communication system 100 in which aspects of the present disclosure may be employed. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, wireless modems, laptop computers, personal computers, etc.

A variety of algorithms and methods may be used for transmissions in the wireless communication system 100 between the base stations 104 and the user terminals 106. For example, signals may be sent and received between the base stations 104 and the user terminals 106 in accordance with single-carrier or OFDM techniques in a band around 60 GHz.

If this is the case, the wireless communication system 100 may be referred to as an Ultra-Wideband (UWB) system.

A communication link that facilitates transmission from a base station 104 to a user terminal 106 may be referred to as a downlink (DL) 108, and a communication link that facilitates transmission from a user terminal 106 to a base station 104 may be referred to as an uplink (UL) 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
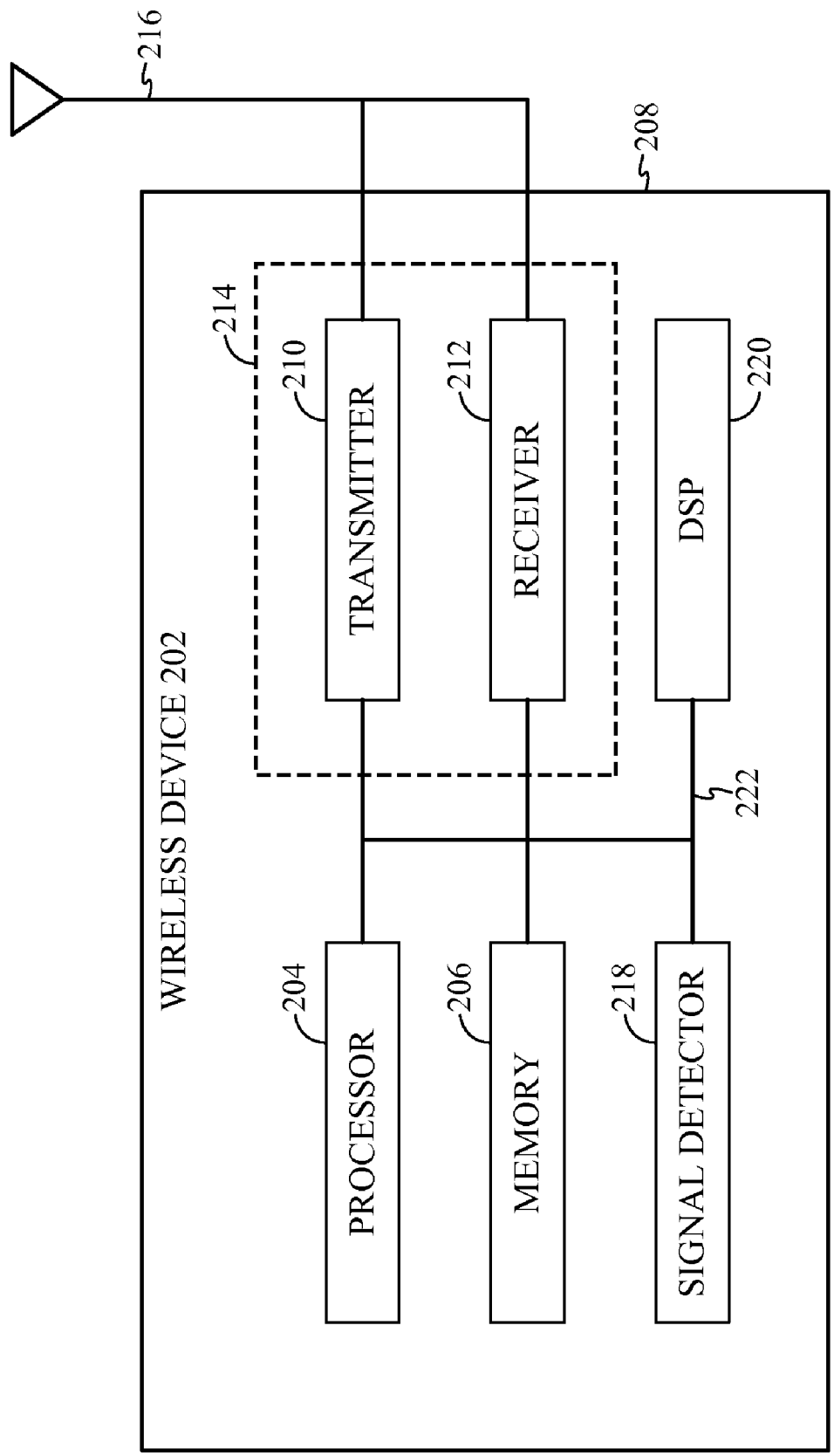
FIG. 2 illustrates various components that may be utilized in a wireless device in accordance with certain aspects of the present disclosure.

FIG. 2 illustrates various components that may be utilized in a wireless device 202 that may be employed within the wireless communication system 100. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

The UWB wireless system 100 may be used for millimeter-wave communications (e.g., communications with a carrier frequency of about 60 GHz). A dual-mode UWB physical layer (PHY) supporting both single-carrier and OFDM modulations may employ a common mode signaling. The common mode is a single-carrier mode used by both single-carrier and OFDM devices for beaconing, network-control signaling, and base-rate data communications. The common mode may be typically required for interoperability between different devices and different networks. Therefore, the system 100 may support both single-carrier and OFDM techniques.

The IEEE 802.15.3c standard is intended to support the dual-mode UWB PHY as the alternative for the existing 802.15.3 Wireless Personal Area Network (WPAN) standard 802.15.3-2003. This alternative IEEE 802.15.3c millimeter-wave WPAN may operate in a new and clear band including 57-64 GHz unlicensed band specified by the Federal Communications Commission (FCC). The millimeter-wave WPAN may allow high coexistence (i.e., close physical spacing) with all other microwave systems in the IEEE 802.15 family of WPANs. In addition, the millimeter-wave WPAN may support high data rate applications (i.e., at least 1 Gbps data rates), such as high speed internet access, streaming video, etc.

In order to provide high quality of service, error-correction codes may be proposed to be utilized in the IEEE 802.15.3c systems, such as low-density parity-check (LDPC) codes. LDPC codes represent forward error-correction codes that may provide error-rate performance very close to channel capacity, which represents a lower bound for wireless transmissions.

Low Density Parity Check Encoding

Figure 3:
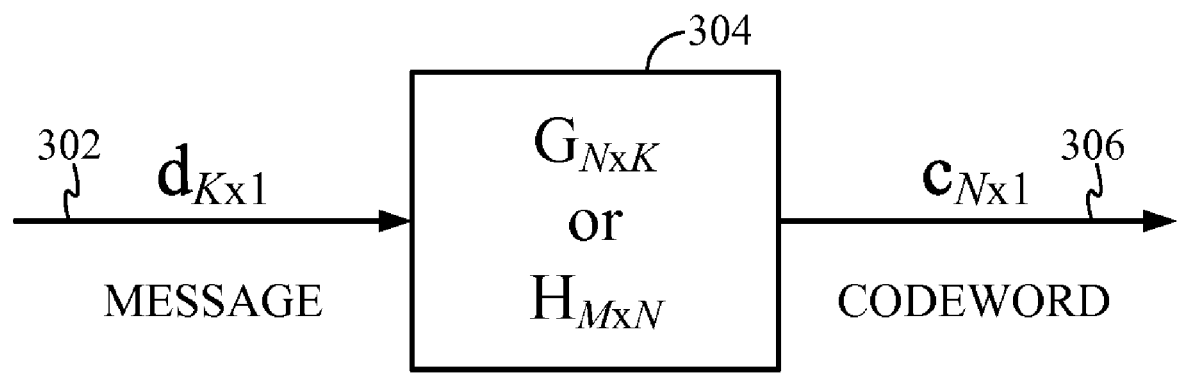
FIG. 3 illustrates an example block diagram of a low-density parity-check (LDPC) encoder in accordance with certain aspects of the present disclosure.

FIG. 3 illustrates an example block diagram of LDPC encoding that may be an integral part of the transmitter 210 in accordance with certain aspects of the present disclosure. An LDPC encoder 304 may be implemented at an access point 104 for a downlink transmission 108 to an access terminal 106. Also, the encoder 304 may be implemented at an access terminal 106 for an uplink transmission 110 to an access point 104.

Information bits 302 may be represented in the form of a vector d of size K×1. After encoding of K information bits, an LDPC codeword 306 may be generated that may comprise a total of N bits, where M bits out of N bits may be redundant. The LDPC encoding may be, in general, represented as:

$$c = G \cdot d, \qquad (1)$$

where c is a codeword vector of size N×1, and G is a generator matrix of size N×K. The generator matrix G is a matrix that may be used for encoding of information bits, as specified by equation (1).

The codeword c from equation (1) may be represented as:

$$c = \begin{bmatrix} d \\ p \end{bmatrix}, \qquad (2)$$

where p is a vector of M=N−K redundant parity-check bits.

An LDPC code may be completely defined by a parity-check matrix (PCM) of size M×N. The PCM may be used for encoding of information bits at a transmitter, as well as for decoding of a received codeword being transmitted over a wireless channel. The following relation between the PCM H and the codeword c may need to be satisfied:

$$H \cdot c = 0, \qquad (3)$$

where 0 is a zero vector of size M×1. Equation (3) represents the matrix form of M=N−K parity-check equations, and M resulting zeros confirms that parity of every parity-check equation is satisfied. Equation (3) combined with equation (2) may be utilized for encoding (i.e., placing redundant parity check bits p into the codeword c) at a transmitter, as well as for decoding (i.e., extracting information bits d from the codeword c) at a receiver.

Structured Multi-Rate Parity Check Matrices

Certain aspects of the present disclosure support a design of structured parity-check matrices (PCMs). These PCMs (i.e., LDPC matrices) may have a common structure for multiple LPDC code rates.

Figure 4:
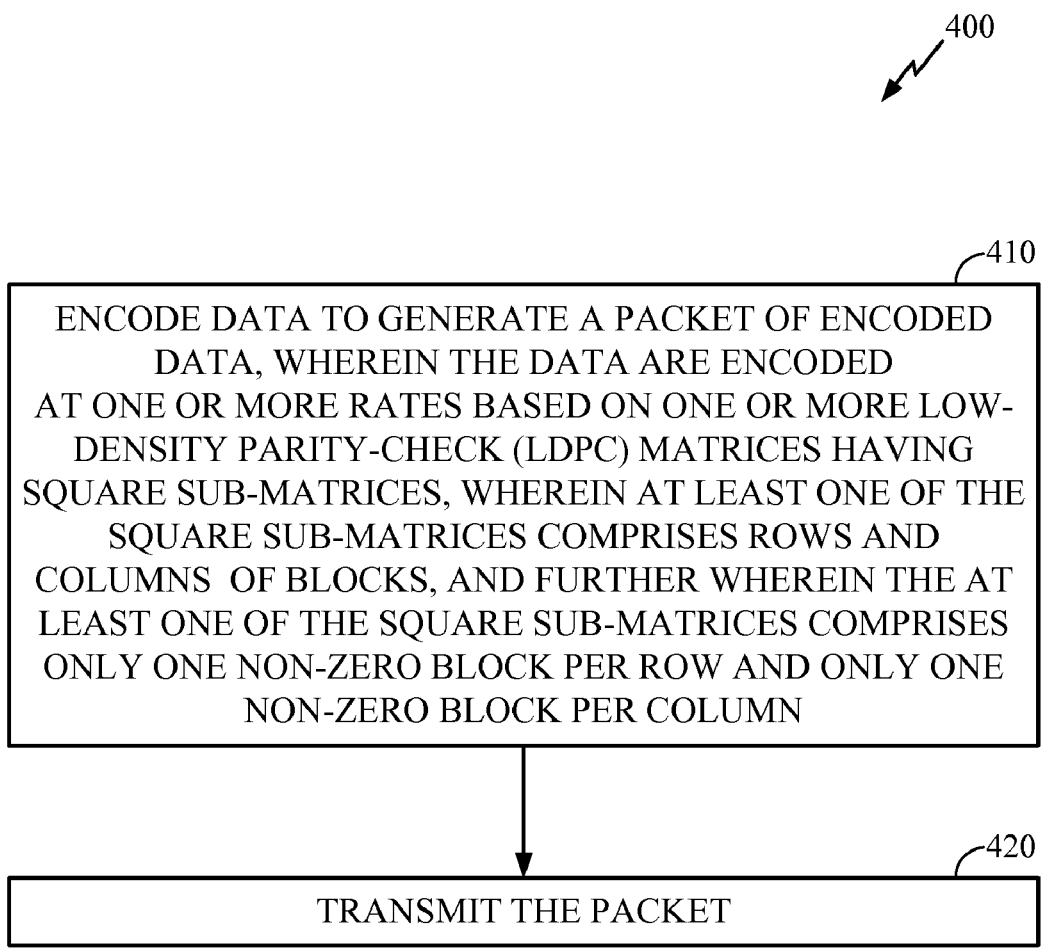
FIG. 4 illustrates operations for encoding of LDPC codes characterized by a structured parity-check matrix (PCM) in accordance with certain aspects of the present disclosure.

FIG. 4 illustrates operations 400 for LDPC encoding based on one or more structured LDPC matrices in accordance with certain aspects of the present disclosure. At 410, data may be encoded to generate a packet of encoded data. The data may be encoded at one or more rates based on the one or more structured LDPC matrices. The LDPC matrices may comprise square sub-matrices, wherein at least one of the square sub-matrices comprises rows and columns of blocks, and further wherein the at least one of the square sub-matrices comprises only one non-zero block per row and only one non-zero block per column. At 420, the generated packet of encoded data may be transmitted.

The structured PCM may be constructed from $K_{base} \times N_{base}$ square sub-matrices. Each square sub-matrix may be itself partitioned into $N_b \times N_b$ square blocks. All blocks may have the same size of $N_{perm} \times N_{perm}$. Each block may be either a zero matrix or a cyclic shift (left or right) of the identity matrix. A block that is obtained by cyclically shifting the identity matrix I by p positions to the left may be represented as $J^p$, where:

$$J^\infty = 0, J^0 = I, J^p = J \cdot J^{p-1}, \text{ and} \quad (4)$$

$$J^1 = \begin{bmatrix} 0 & 0 & \ldots & 0 & 1 \\ 1 & 0 & \ldots & 0 & 0 \\ 0 & 1 & 0 & \ldots & 0 \\ \vdots & \ddots & \ddots & \ddots & \vdots \\ 0 & \ldots & 0 & 1 & 0 \end{bmatrix}. \quad (5)$$

Figure 5:
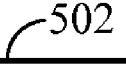
FIG. 5 illustrates an example of a sub-matrix within the structured PCM in accordance with certain aspects of the present disclosure.

Each sub-matrix of a structured PCM may comprise only one non-zero block per row of blocks and only one non-zero block per column of blocks of such sub-matrix. FIG. 5 illustrates an example of a sub-matrix 502 within a structured PCM with $N_b = 3$ in accordance with certain aspects of the present disclosure. It can be observed that the sub-matrix illustrated in FIG. 5 may use the exponent p from equation (4) equal to 3, 7, and 8.

A plurality of sub-matrices that are vertically under each other within the structured PCM (i.e., sub-matrices belonging to the same columns of blocks of the PCM but to different rows of blocks) may use the same set or different sets of exponents. If the same set of exponents is used, then a particular pattern of non-zero blocks may determine how a corresponding sub-matrix from the plurality of sub-matrices is filled with non-zero blocks.

For example, when $N_b = 4$ there may be $4! = 4 \times 3 \times 2 \times 1 = 24$ distinct patterns of non-zero blocks within a square sub-matrix partitioned into $N_b \times N_b$ blocks. For $N_b = 3$ there may be six distinct patterns, and for $N_b = 5$ there may be 120 patterns. In general, for a given $N_b$ there may be $N_b! = N_b \times (N_b - 1) \times (N_b - 2) \times \ldots \times 1$ possible patterns. FIG. 6 illustrates an example PCM of rate-½ LDPC code, where $N_b = 3$, $N_{perm} = 21$ and where different patterns with the same set of exponents may be used to fill sub-matrices of the PCM along the same columns of blocks and different rows of blocks.

In general, sub-matrices located along the same set of columns of blocks of the PCM but along different sets of rows of blocks may not need to use the same set of exponents. FIG. 7 illustrates an example PCM of rate-½ LDPC code where different sets of exponents may be used along the same set of columns of blocks and different rows of blocks of the PCM.

In one aspect of the present disclosure, a structured PCM of rate-⅚ LDPC code may be obtained by combining non-zero blocks from each set of three rows of blocks of the PCM illustrated in FIG. 6 into a single row of blocks. FIG. 8 illustrates the generated structured PCM of rate-⅚ LDPC code.

Moreover, it may be possible to combine different number of rows of blocks of the structured PCM of rate-½ LDPC code to obtain a PCM of different rates. For example, first two rows of blocks of the PCM from FIG. 6 may be combined into a single row of blocks, but the third row of blocks of the PCM from FIG. 6 may not be combined with any other row of blocks. In this way, a structured rate-⅔ PCM may be generated, which is illustrated in FIG. 9. In general, any number of rows of blocks belonging or not to the same square sub-matrices may be combined to generate various code rates from a common structured PCM.

Efficiently Encodable Parity Check Matrices

Certain aspects of the present disclosure support structured parity-check matrices for LDPC codes that may be suitable for high-speed encoding with affordable computational complexity. In order to enable efficient encoding, previously constructed PCMs may be modified by replacing some non-zero blocks with zero blocks of the same size. For certain aspects of the present disclosure, the encoding process based on these modified PCMs may be efficiently implemented by employing a limited number of exclusive-OR (XOR) logical operations applied on information bits in order to incorporate redundant parity-check bits into a codeword, while the processing latency may be small.

In one aspect of the present disclosure, a structure of a PCM may be block triangular or block stair-case (for example, in the right side, or in the left side, or in any other direction), which may be suitable for efficient high-speed LDPC encoding. FIG. 10 illustrates an example block-triangular PCM of rate-½ LDPC code obtained after modifying the PCM from FIG. 6 by replacing some non-zero blocks on the right side of this PCM with zero blocks of the same size.

FIG. 11 illustrates an example PCM of rate-½ LDPC code with the stair-case structure, which may be also obtained after modifying the PCM from FIG. 6 by replacing some non-zero blocks on the right side of this PCM with zero blocks of the same size. The PCM from FIG. 11 may also be characterized as the block triangular matrix because the block triangular structure may be obtained by swapping rows of blocks 4, 5, and 6 with rows of blocks 1, 2, and 3, respectively.

FIG. 12 illustrates an example of the PCM structure suitable for efficient encoding of rate-⅚ LDPC code in accordance with certain aspects of the present disclosure. This PCM may be obtained by modifying the PCM from FIG. 8 by replacing some non-zero blocks on the right side with zero blocks of the same size.

A block triangular PCM H of size M×N may be partitioned into a sub-matrix $H_d$ of size M×K and a sub-matrix $H_p$ of size M×M corresponding to an information and a redundant portion of the PCM H, respectively:

$$H = [H_d H_p]. \quad (6)$$

The equation (3) may be now rewritten as:

$$[H_d \ H_p] = \begin{bmatrix} d \\ p \end{bmatrix} = 0. \quad (7)$$

According to equation (7), equation (3) may be expressed as:

$$H_p \cdot p = H_d \cdot d = v_{K \times 1}, \quad (8)$$

where v is an intermediate vector of size K×1 that may be employed for calculating the parity-check vector p. The parity-check vector p may be solved by first calculating the vector v defined by $v = H_d \cdot d$, wherein d and $H_d$ may be known. Then, $H_p \cdot p = v$ may be used to solve p.

In one aspect of the present disclosure, as illustrated in FIG. 13, $H_p$ may comprise a triangular matrix comprising an arrangement of sub-matrices A, B, C, D, E, F, Q, R, S, and T having non-zero values shown as follows:

$$\begin{bmatrix} v_0 \\ v_1 \\ v_2 \\ v_3 \end{bmatrix} = \begin{bmatrix} A & 0 & 0 & 0 \\ B & C & 0 & 0 \\ D & E & F & 0 \\ Q & R & S & T \end{bmatrix} \cdot \begin{bmatrix} p_0 \\ p_1 \\ p_2 \\ p_3 \end{bmatrix}, \quad (9)$$

where v and p may be represented with sub-vectors as:

$$v = \begin{bmatrix} v_0 \\ v_1 \\ v_2 \\ v_3 \end{bmatrix} \text{ and } p = \begin{bmatrix} p_0 \\ p_1 \\ p_2 \\ p_3 \end{bmatrix}, \quad (10)$$

The relationship $H_p \cdot p = v$ from equation (8) may be expressed according to equation (9) as:

$$Ap_0 = v_0, \quad (11)$$

$$Bp_0 + Cp_1 = v_1, \quad (12)$$

$$Dp_0 + Ep_1 + Fp_2 = v_2, \quad (13)$$

$$Qp_0 + Rp_1 + Sp_2 + Tp_3 = v_3. \quad (14)$$

The parity-check vector p may be calculated by exploiting the triangular structure of the parity check matrix $H_p$ to generate a sequence of equations that may be efficiently solved:

$$p_0 = A^{-1} v_0, \quad (15)$$

$$p_1 = C^{-1}(v_1 + Bp_0), \quad (16)$$

$$p_2 = F^{-1}(v_2 + Dp_0 + Ep_1), \quad (17)$$

$$p_3 = T^{-1}(v_3 + Qp_0 + Rp_1 + Sp_2). \quad (18)$$

Inverted versions of the sub-matrices A, C, F, and T may be pre-computed and stored in advance. Each entry of the inverted matrices $A^{-1}$, $C^{-1}$, $F^{-1}$, and $T^{-1}$ may be computed with low computational complexity based on a sum of cyclic shifts of the identity matrix.

For certain aspects of the present disclosure, encoders and encoding methods may be configured to provide any of various coding rates by partitioning a corresponding PCM H into an information matrix $H_d$ of size M×K, and into a redundant matrix $H_p$ of size M×M.

Certain aspects of the present disclosure support a PCM with a dual diagonal structure of non-zero blocks within the redundant sub-matrix $H_p$ of size M×M. This particular structure of the PCM may be also suitable for high-speed LDPC encoding with affordable computational complexity based on the method given by equations (11)-(18).

Figure 4A:
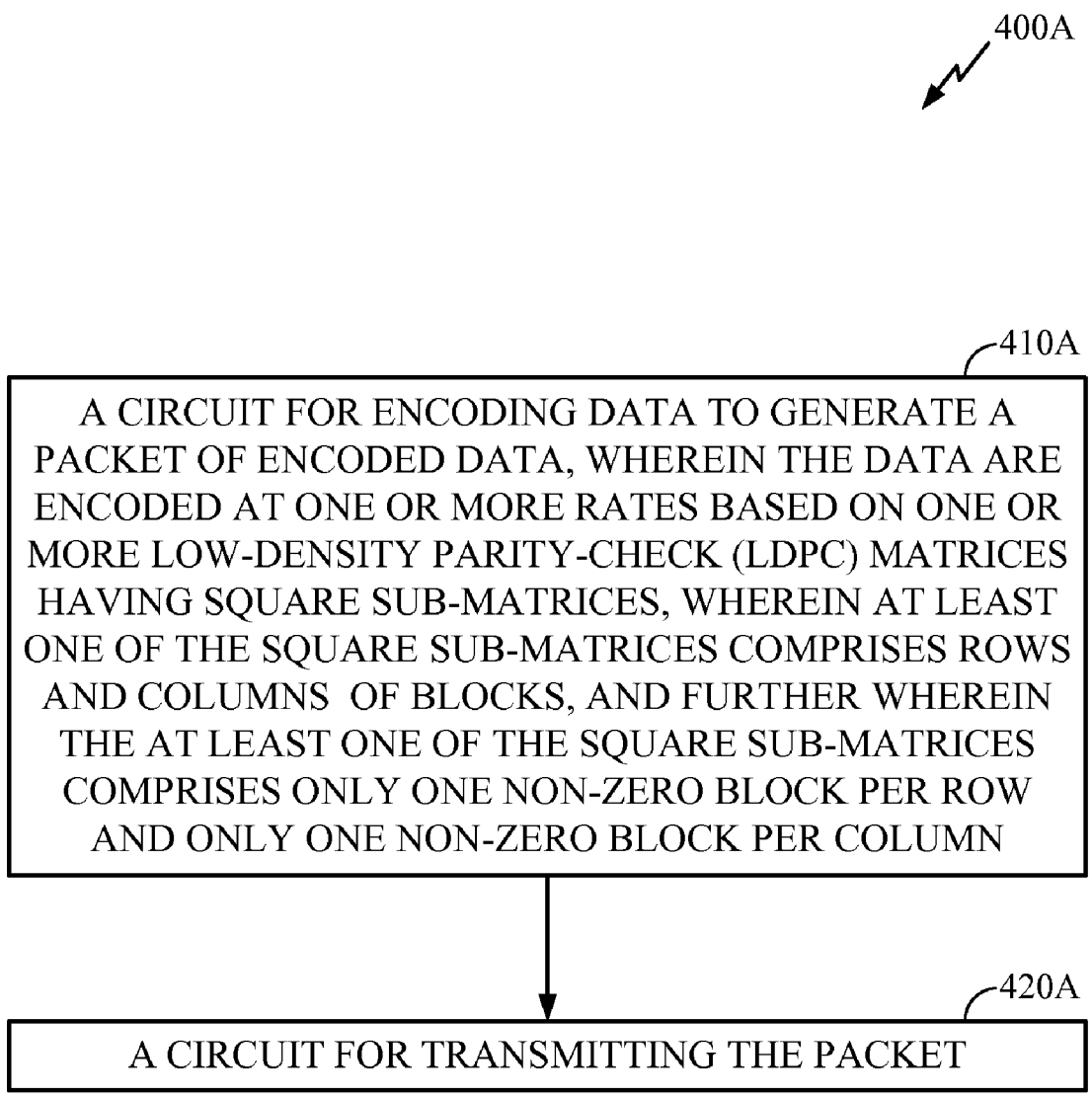
FIG. 4A illustrates example components capable of performing the operations illustrated in FIG. 4.

The various operations of methods described above may be performed by any suitable means capable of performing the corresponding functions. The means may include various hardware and/or software component(s) and/or module(s), including, but not limited to a circuit, an application specific integrate circuit (ASIC), or processor. Generally, where there are operations illustrated in Figures, those operations may have corresponding counterpart means-plus-function components with similar numbering. For example, blocks 410-420 illustrated in FIG. 4 correspond to circuit blocks 410A-420A illustrated in FIG. 4A.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The techniques provided herein may be utilized in a variety of applications. For certain aspects, the techniques presented herein may be incorporated in an access point station, an access terminal, or other type of wireless device with processing logic and elements to perform the techniques provided herein.

The invention claimed is:

1. A method for wireless communications, comprising:
obtaining one or more low-density parity-check (LDPC) matrices having square sub-matrices, wherein at least one of the square sub-matrices comprises rows and columns of blocks, and wherein the at least one of the square sub-matrices comprises only one non-zero block per row and only one non-zero block per column;
encoding data at one or more rates using the one or more LDPC matrices to generate a packet of encoded data; and
transmitting the packet.

2. The method of claim 1, wherein the LDPC matrices are rate half.

3. The method of claim 1, wherein:
the LDPC matrices are of a first rate of the one or more rates; and
at least two rows of blocks of one or more of the LDPC matrices are combined to generate one or more other LDPC matrices of a second rate of the one or more rates, the second rate being different from the first rate.

4. The method of claim 3, wherein the second rate is A/B, A and B are positive integers and A is less than B.

5. The method of claim 1, wherein each block comprises a zero square matrix or a cyclic shift of an identity matrix.

6. The method of claim 1, wherein each square sub-matrix has a dimension of one of 3×3 blocks, 4×4 blocks and 5×5 blocks.

7. The method of claim 1, wherein some of the square sub-matrices comprise all zero blocks.

8. The method of claim 1, wherein:
at least one of the LDPC matrices of size R×C blocks comprises a first portion of size $R \times C_1$ blocks and a second portion of size $R \times C_2$ blocks;

$C_1 + C_2 = C$; and the first portion comprises only one non-zero block per column of blocks.

9. The method of claim 1, further comprising:
generating the one or more LDPC matrices from another LDPC matrix of size $K_{base} \times N_{base}$ square sub-matrices, and
wherein each of the $K_{base} \times N_{base}$ square sub-matrices comprises rows and columns of blocks, and further wherein each of the $K_{base} \times N_{base}$ square sub-matrices comprises only one non-zero block per row and only one non-zero block per column.

10. The method of claim 9, wherein the generation comprises:
replacing at least some of the non-zero blocks with zero blocks of the same size.

11. The method of claim 9, wherein the generation comprises:
combining at least two rows of blocks of the another LDPC matrix to obtain a second LDPC matrix of a rate that is higher than a rate of the another LDPC matrix; and
replacing at least some of the non-zero blocks of the second LDPC matrix of the higher rate with zero blocks of the same size.

12. An apparatus for wireless communications, comprising:
a circuit configured to obtain one or more low-density parity-check (LDPC) matrices having square sub-matrices, wherein at least one of the square sub-matrices comprises rows and columns of blocks, and wherein the at least one of the square sub-matrices comprises only one non-zero block per row and only one non-zero block per column;
an encoder configured to encode data at one or more rates using the one or more LDPC matrices to generate a packet of encoded data; and
a transmitter configured to transmit the packet.

13. The apparatus of claim 12, wherein the LDPC matrices are rate half.

14. The apparatus of claim 12, wherein:
the LDPC matrices are of a first rate of the one or more rates; and
at least two rows of blocks of one or more of the LDPC matrices are combined to generate one or more other LDPC matrices of a second rate of the one or more rates, the second rate being different from the first rate.

15. The apparatus of claim 14, wherein the second rate is A/B, A and B are positive integers and A is less than B.

16. The apparatus of claim 12, wherein each block comprises a zero square matrix or a cyclic shift of an identity matrix.

17. The apparatus of claim 12, wherein each square sub-matrix has a dimension of one of 3×3 blocks, 4×4 blocks and 5×5 blocks.

18. The apparatus of claim 12, wherein some of the square sub-matrices comprise all zero blocks.

19. The apparatus of claim 12, wherein:
at least one of the LDPC matrices of size R×C blocks comprises a first portion of size R×$C_1$ blocks and a second portion of size R×$C_2$ blocks;

$C_1+C_2=C$; and the first portion comprises only one non-zero block per column of blocks.

20. The apparatus of claim 12, further comprising:
a generator configured to generate the one or more LDPC matrices from another LDPC matrix of size $K_{base}$×$N_{base}$ square sub-matrices, and wherein each of the $K_{base}$×$N_{base}$ square sub-matrices comprises rows and columns of blocks, and further wherein each of the $K_{base}$×$N_{base}$ square sub-matrices comprises only one non-zero block per row and only one non-zero block per column.

21. The apparatus of claim 20, wherein the generator comprises:
a replacing circuit configured to replace at least some of the non-zero blocks with zero blocks of the same size.

22. The apparatus of claim 20, wherein the generator comprises:
a combiner configured to combine at least two rows of blocks of the another LDPC matrix to obtain a second LDPC matrix of a rate that is higher than a rate of the another LDPC matrix; and
a replacing circuit configured to replace at least some of the non-zero blocks of the second LDPC matrix of the higher rate with zero blocks of the same size.

23. An apparatus for wireless communications, comprising:
means for obtaining one or more low-density parity-check (LDPC) matrices having square sub-matrices, wherein at least one of the square sub-matrices comprises rows and columns of blocks, and wherein the at least one of the square sub-matrices comprises only one non-zero block per row and only one non-zero block per column;
means for encoding data at one or more rates using the one or more LDPC matrices to generate a packet of encoded data; and
means for transmitting the packet.

24. The apparatus of claim 23, wherein the LDPC matrices are rate half.

25. The apparatus of claim 23, wherein:
the LDPC matrices are of a first rate of the one or more rates; and
at least two rows of blocks of one or more of the LDPC matrices are combined to generate one or more other LDPC matrices of a second rate of the one or more rates, the second rate being different from the first rate.

26. The apparatus of claim 25, wherein the second rate is A/B, A and B are positive integers and A is less than B.

27. The apparatus of claim 23, wherein each block comprises a zero square matrix or a cyclic shift of an identity matrix.

28. The apparatus of claim 23, wherein each square sub-matrix has a dimension of one of 3×3 blocks, 4×4 blocks and 5×5 blocks.

29. The apparatus of claim 23, wherein some of the square sub-matrices comprise all zero blocks.

30. The apparatus of claim 23, wherein:
at least one of the LDPC matrices of size R×C blocks comprises a first portion of size R×$C_1$ blocks and a second portion of size R×$C_2$ blocks;

$C_1+C_2=C$; and the first portion comprises only one non-zero block per column of blocks.

31. The apparatus of claim 23, further comprising:
means for generating the one or more LDPC matrices from another LDPC matrix of size $K_{base}$×$N_{base}$ square sub-matrices, and
wherein each of the $K_{base}$×$N_{base}$ square sub-matrices comprises rows and columns of blocks, and further wherein each of the $K_{base}$×$N_{base}$ square sub-matrices comprises only one non-zero block per row and only one non-zero block per column.

32. The apparatus of claim 31, wherein the means for generating comprises:
means for replacing at least some of the non-zero blocks with zero blocks of the same size.

33. The apparatus of claim 31, wherein the means for generating comprises:
means for combining at least two rows of blocks of the another LDPC matrix to obtain a second LDPC matrix of a rate that is higher than a rate of the another LDPC matrix; and
means for replacing at least some of the non-zero blocks of the second LDPC matrix of the higher rate with zero blocks of the same size.

34. A computer-program product for wireless communications, comprising a non-transitory computer-readable medium encoded with instructions executable to:
obtain one or more low-density parity-check (LDPC) matrices having square sub-matrices, wherein at least one of the square sub-matrices comprises rows and columns of blocks, and wherein the at least one of the square sub-matrices comprises only one non-zero block per row and only one non-zero block per column;
encode data at one or more rates using the one or more LDPC matrices to generate a packet of encoded data; and
transmit the packet.

35. A wireless node, comprising:
at least one antenna;
a circuit configured to obtain one or more low-density parity-check (LDPC) matrices having square sub-matrices, wherein at least one of the square sub-matrices comprises rows and columns of blocks, and wherein the at least one of the square sub-matrices comprises only one non-zero block per row and only one non-zero block per column;
an encoder configured to encode data at one or more rates using the one or more LDPC matrices to generate a packet of encoded data; and
a transmitter configured to transmit the packet via the at least one antenna.

* * * * *